United States Patent [19]
Benzing et al.

[11] Patent Number: 5,653,813
[45] Date of Patent: Aug. 5, 1997

[54] CYCLONE EVAPORATOR

[75] Inventors: Jeffrey C. Benzing, Saratoga; Edward J. McInerney; Michael N. Susoeff, both of San Jose, all of Calif.

[73] Assignee: Novellus Systems, Inc., San Jose, Calif.

[21] Appl. No.: 415,268

[22] Filed: Apr. 3, 1995

[51] Int. Cl.$^6$ ............................................. C23C 16/00
[52] U.S. Cl. ..................... 118/726; 261/792; 261/142
[58] Field of Search ................. 118/726; 261/79.2, 261/142; 55/238

[56] References Cited

U.S. PATENT DOCUMENTS

| | | | |
|---|---|---|---|
| 1,183,098 | 5/1916 | Merrell | 261/79.2 |
| 3,969,449 | 7/1976 | Shires et al. | 261/153 |
| 4,726,686 | 2/1988 | Wolf | 366/165 |
| 4,734,109 | 3/1988 | Cox | 55/92 |
| 5,059,357 | 10/1991 | Wolf | 261/53 |
| 5,203,925 | 4/1993 | Shibuya | 118/724 |
| 5,204,314 | 4/1993 | Kirlin et al. | 505/1 |
| 5,252,134 | 10/1993 | Stauffer | 118/726 |
| 5,372,754 | 12/1994 | Ono | 261/142 |
| 5,383,970 | 1/1995 | Asaba | 118/726 |

FOREIGN PATENT DOCUMENTS

| | | | |
|---|---|---|---|
| 0058571 | 8/1982 | European Pat. Off. | |
| 0559259 | 9/1993 | European Pat. Off. | |
| 1-257189 | 10/1989 | Japan | 118/726 |
| 2-290963 | 11/1990 | Japan | 118/726 |
| WO9105743 | 5/1991 | WIPO | |

OTHER PUBLICATIONS

Patent Abstracts of Japan, vol. 17, No. 499 (C–1109) 9 Sep. 1993 & JP-A-05 132779 (Matsushita Electric Ind Co Ltd) 28 May 1993.

J.J. Sullivan et al., "Mass Flow Measurement and Control for Low Vapor Pressure Sources", J. Vac. Sci. Technol. A7(3), May/Jun. 1989, pp. 2387–2392.

S.D. Hersee et al., "The Operation of Metalogranic Bubblers at Reduced Pressure", J. Va. Sci. Technol. A8(2) Mar./Apr. 1990, pp. 800–804.

R. Ulrich, et al., "MOCVD of Superconducting YBCO Films Using and Aerosol Feed System", Extended Abstracts, American Institute of Chemical Engineers, 1994 Annual Meeting Nov. 13–18, 1994, p. 16.

*Primary Examiner*—Richard Bueker
*Assistant Examiner*—Jeffrie R. Lund
*Attorney, Agent, or Firm*—Skjerven, Morrill, MacPherson, Franklin & Friel; David E. Steuber

[57] ABSTRACT

A cyclone evaporator includes an evaporator body with an evaporation chamber therein. The evaporation chamber preferably includes a thermally conductive sidewall having a generally cylindrical upper portion and a downwardly tapered lower portion. The evaporator body further includes a cover having a vapor outlet opening into the evaporation chamber and an outlet tube. The outlet tube circumscribes the vapor outlet and extends into a lower portion of the evaporation chamber. A liquid precursor passage and a carrier gas passage extend through the evaporator body and open into the evaporation chamber. In one embodiment, the carrier gas passage is positioned to direct carrier gas parallel to liquid precursor flow and intersect the liquid precursor at a liquid precursor passage outlet within the evaporation chamber. In another embodiment, the carrier gas passage is positioned to direct carrier gas across an outlet of liquid precursor passage. In both embodiments, the carrier gas facilitates atomization of the liquid precursor and flows cyclonically to distribute the atomized liquid precursor within the evaporation chamber. The liquid precursor deposits on the thermally conductive evaporation chamber wall and evaporates to form a gas precursor. The gas precursor flows with the carrier gas and exits the cyclone evaporator through the outlet tube and the vapor outlet. The cyclone evaporator is particularly advantageous for evaporating low vapor pressure liquids useful in semiconductor fabrication processes such as chemical vapor deposition.

25 Claims, 4 Drawing Sheets

CYCLONE EVAPORATOR

BACKGROUND OF THE INVENTION

1. Field of the Invention

This invention relates to the conversion of liquid phase materials into vapor phase materials, and more particularly relates to the conversion of liquid phase materials into vapor phase materials in a cyclone evaporator for use in a variety of applications.

2. Description of Related Art

A variety of applications use vapor (gas) phase materials. One such application involves the fabrication of integrated circuit elements on a wafer in a chemical vapor deposition ("CVD") reaction chamber. To deposit materials on the wafer in the CVD reaction chamber, a composition of reactant gases and carrier gases is introduced into the CVD reaction chamber. The reactant gases chemically react to facilitate formation of the integrated circuit elements. In a growing number of CVD processes, one source of the reactant gas introduced into the CVD reaction chamber is an evaporated liquid precursor.

The liquid precursor may be either an organic or inorganic compound and has a characteristic vapor pressure that depends on the liquid precursor chemical composition. When depositing metal in a CVD reaction chamber, metal-organic liquids are generally used as the liquid precursors. The metal-organic liquid precursors typically have very low vapor pressures at room temperature and very fine decomposition points. Liquid precursors characterized by low vapor pressures have presented a significant challenge of increasing the vapor pressures of the liquid precursors to produce a controlled and economical quantity of vapor phase precursor ("gas precursor") while controlling liquid precursor evaporation rate and preventing decomposition.

The traditional way to evaporate liquid precursors is to use a bubbler such as those manufactured by Schumacher Inc. of Carlsbad, Calif. In the bubbler, the liquid precursor is maintained at an elevated temperature while a carrier gas is bubbled through it. As the carrier gas bubbles through the liquid precursor, a portion of the liquid precursor undergoes a transformation from liquid phase to vapor phase to form a gas precursor. The carrier gas entrains the gas precursor and transports it to the CVD reaction chamber.

Bubblers have several disadvantages. For example, the liquid precursor must be kept at elevated temperatures for extended periods of time by elevating the temperature of a surface element in proximate contact with a portion of the liquid precursor. The liquid precursor portion in proximate contact with the elevated temperature surface element often disadvantageously decomposes which denigrates the integrity of the liquid precursor. Furthermore, the gas precursor flow rate is a sensitive function of both the liquid precursor temperature and the remaining liquid precursor volume. Therefore, the liquid precursor volume must be monitored and the surface element temperature adjusted accordingly to maintain a steady flow of gas precursor.

A second approach to evaporating liquid precursor involves atomizing the liquid precursor and evaporating the droplets in a hot gas stream as discussed in an abstract by Richard Ulrich, et al, "MOCVD of Superconducting YBCO Films Using an Aerosol Feed System," Extended Abstracts, American Institute of Chemical Engineers 1994 Annual Meeting, Nov. 13–18, 1994, p. 16. However, this approach is unsuitable when used with low vapor pressure liquid precursors. When used with low vapor pressure liquids, the initial evaporation cools the droplet to a point where it has negligible vapor pressure (vapor pressure depends non-linearly on temperature). The gas precursor thus formed provides an insufficient quantity and an unsteady flow of gas precursor to efficiently and accurately sustain a CVD process.

A third approach to evaporating the liquid precursor involves flash vaporizing liquid precursor on a vaporization matrix structure at an elevated temperature as described in U.S. Pat. No. 5,204,314, by Kirlin, et al.

SUMMARY OF THE INVENTION

The present invention overcomes the disadvantages of the related art and efficiently produces a sufficient quantity of gas precursor having an approximately uniform molecular composition to sustain a quality, commercially viable CVD process.

The present invention is directed to a cyclone evaporator which facilitates the introduction of liquid precursor droplets into an evaporation chamber which are entrained by introduced carrier gas. The cyclone evaporator directs the carrier gas and entrained liquid precursor flow so that a thin layer of liquid precursor is very controllably introduced on a heated evaporation chamber wall where the liquid precursor evaporates. The evaporated precursor exits the cyclone evaporator along with the carrier gas.

In one embodiment, the present invention is an evaporator in a CVD system that utilizes a carrier gas and precursor. The evaporator includes a body, a chamber disposed in the body, an atomizer assembly having a carrier gas inlet and a liquid precursor inlet, and further having an opening into the chamber, and a vapor outlet extending through the body from the chamber.

In another embodiment the present invention includes an evaporator, the evaporator including a body, an evaporation surface supported by the body. The evaporation surface is curved and includes a first section that defines a first contained space of a predetermined cross-sectional area, and includes a second section that defines a second contained space of a predetermined cross-sectional area less than the cross-sectional area of the first contained space. The evaporator further includes a first port directed generally tangentially to the first section evaporator surface, and a second port disposed in the second contained space.

In a further embodiment the present invention includes a process of evaporating a liquid. The process includes the steps of introducing liquid precursor into the evaporator, introducing carrier gas into the evaporator, entraining at least a portion of the liquid precursor in the carrier gas, depositing the entrained liquid precursor on at least a portion of the evaporator surface, and heating the evaporator surface to evaporate the deposited liquid precursor.

BRIEF DESCRIPTION OF THE DRAWINGS

Reference numerals referring to the same feature appearing in multiple figures are the same.

The features, aspects, and advantages of the present invention will become better understood with regard to the following description, appended claims, and accompanying drawings where:

DETAILED DESCRIPTION

The description of the invention is intended to be illustrative only and not limiting.

Figure 1:
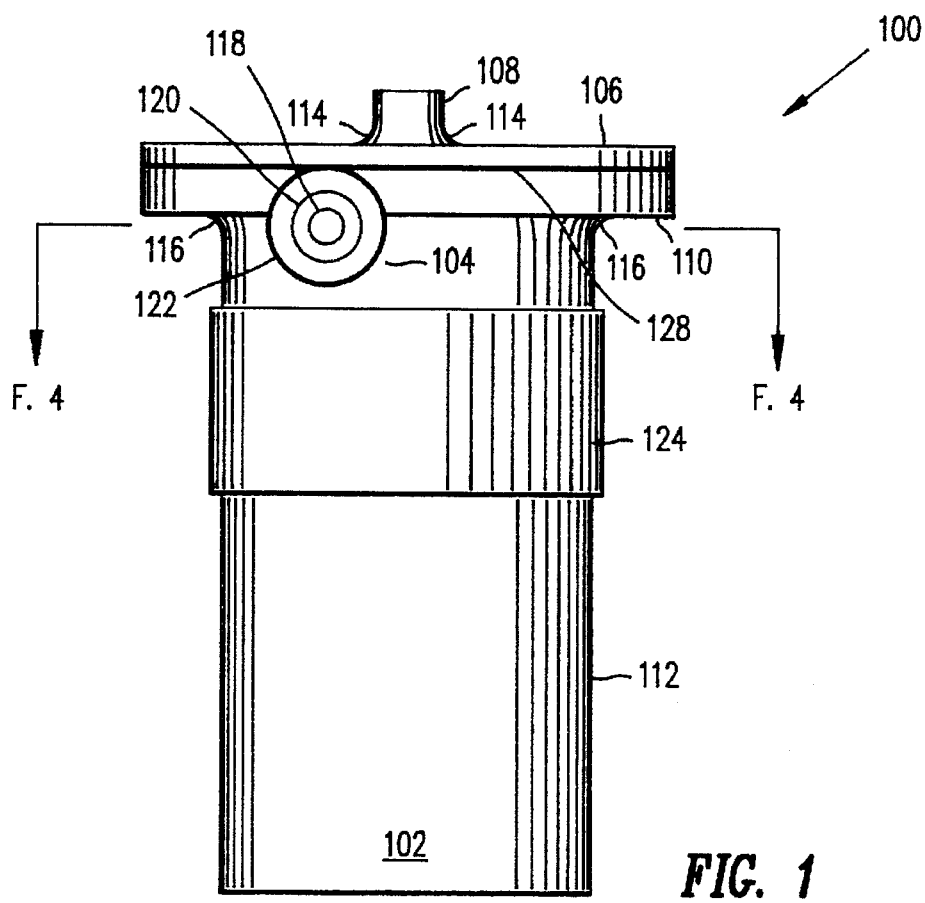
FIG. 1 illustrates a side plan view of a cyclone evaporator.

Referring to FIG. 1, an illustrative cyclone evaporator 100 is shown. Advantageously, the cyclone evaporator 100 very controllably and rapidly evaporates liquid precursor without decomposing the liquid precursor. The cyclone evaporator 100 is especially advantageous in evaporating low vapor pressure liquid precursor in quantities sufficient to efficiently sustain a CVD process. Furthermore, the cyclone evaporator 100 advantageously allows gas precursor to exit the cyclone evaporator into CVD reactor assembly 706 (FIG. 7) while simultaneously preventing liquid precursor from exiting the cyclone evaporator 100. Although the cyclone evaporator 100 is discussed in conjunction with a CVD process and a CVD reactor assembly 706 (FIG. 7), other devices may be attached to the cyclone evaporator 100 in addition to the CVD reactor assembly 706 (FIG. 7) or as an alternative to the CVD reactor assembly 706 (FIG. 7), and other processes may utilize the cyclone evaporator 100. However, for illustration purposes, the CVD reactor assembly 706 (FIG. 7) and CVD processes will be referred to below in conjunction with the cyclone evaporator 100.

Figure 3:
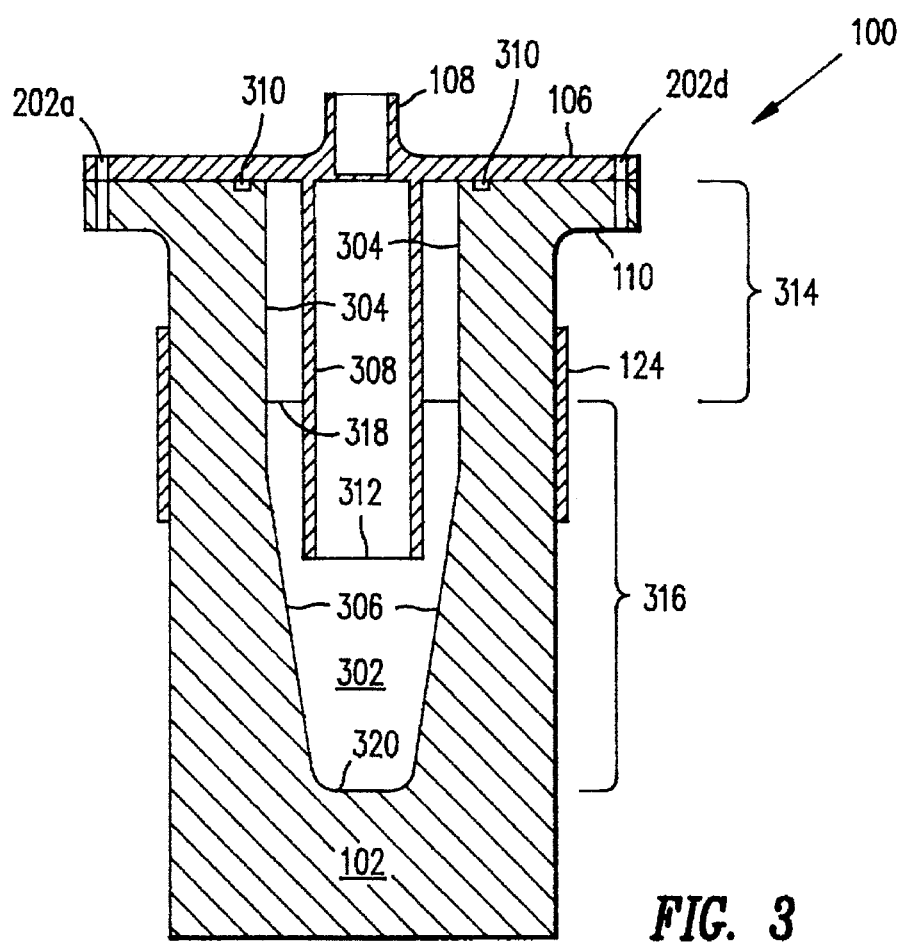
FIG. 3 illustrates a cross-sectional view of the cyclone evaporator of FIGS. 1 and 2, taken at section F.3 shown in FIG. 2.

FIG. 1 illustrates an embodiment of a cyclone evaporator. FIG. 1 presents a side view of cyclone evaporator 100 showing an evaporator body 102 and a carrier gas channel 104. The evaporator body 102 includes an upper surface 128 having flange 110 to mate with and support a cover 106. Although upper surface 128 is depicted in FIGS. 1 and 3 having flange 110, other embodiments of cyclone evaporator 100 may be fabricated without flange 110. Evaporator body 102 is preferably fabricated from a material having good thermal conductivity with approximately uniform thermal conductivity characteristics. Furthermore, evaporator body 102 is preferably non-reactive to materials used in conjunction with the cyclone evaporator 100. Aluminum is a suitable material from which to fabricate the evaporator body 102.

The shape of evaporator body 102 below flange 110 is that of an approximately right circular cylinder. The height of the evaporator body 102 from the top surface of cover 106 to the bottom of evaporator body 102 is 6.125 inches and the diameter of the evaporator body 102 below flange. 110 is 3.25 inches. The height of flange 110 is 0.37 inches, and the height of cover 106 is 0.220 inches. Fillet 116, with a nominal radius of 0.20 inches, is fabricated at the transition of the flange 110 and the exterior surface 112 of the evaporator body 102.

Figure 7:
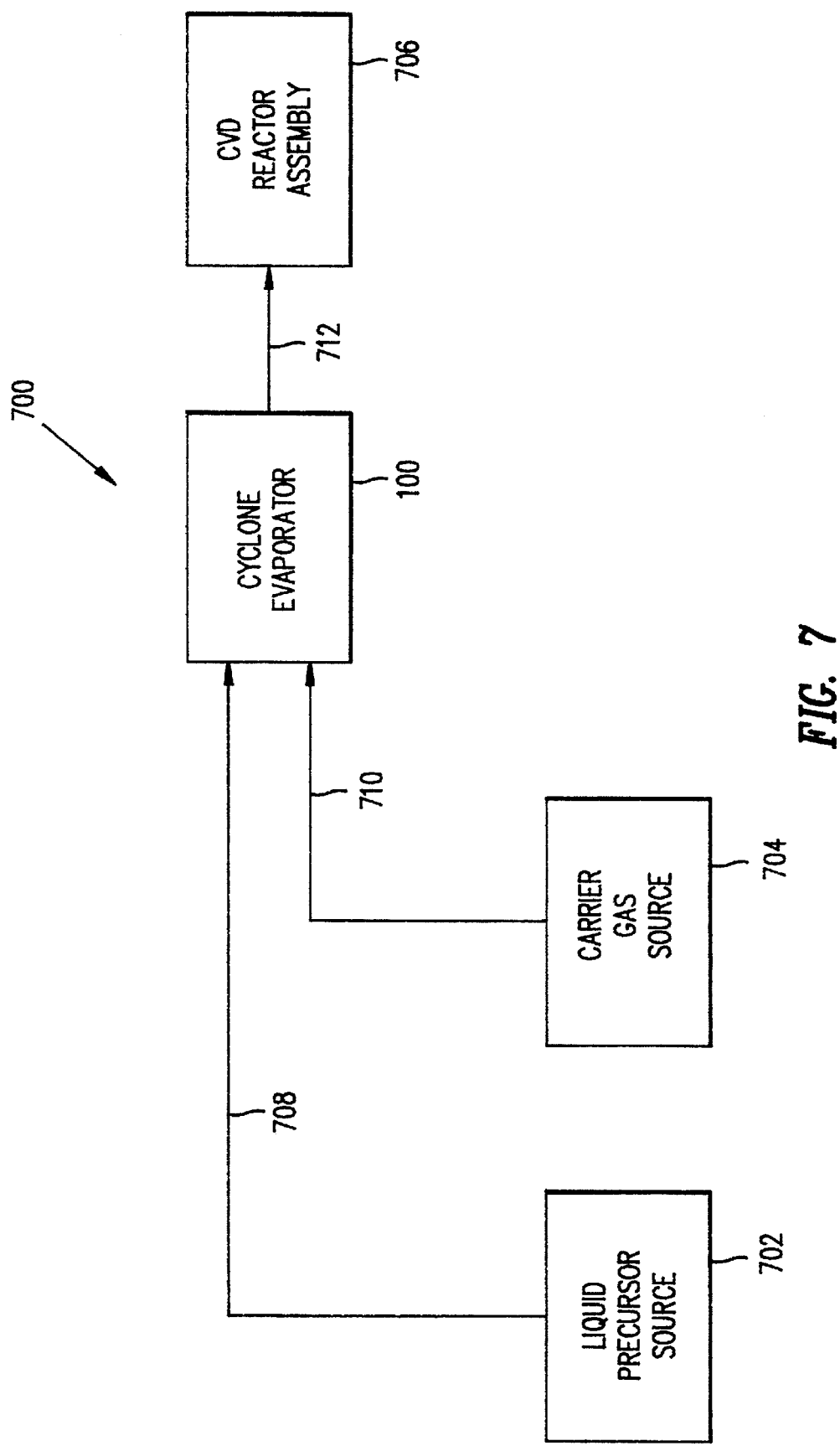
FIG. 7 illustrates a block diagram of a chemical vapor deposition system.

Referring to FIG. 1, the cover 106 includes an integral vapor port 108. The height of vapor port 108 above the top surface of cover 106 is 1.25 inches. The vapor port 108 has an external diameter of 0.5 inches and an internal diameter of 0.4 inches. The internal diameter of the vapor port 108 is preferably large enough to permit a desired rate of gas precursor flow out of the cyclone evaporator 100. Fillet 114, with a nominal radius of 0.25 inches, is fabricated at the transition of the vapor port 108 and the cover 106. A 0.5 inch outside. diameter tubing (stainless steel) connected with 0.5 inch VCR® metal gasket face seal fitting is used to couple the cyclone evaporator 100 to the CVD reactor 706 (FIG. 7).

FIG. 1 shows a direct view into carrier gas channel 104. Carrier gas channel 104 is fabricated having an inlet portion to accommodate connection of a carrier gas source 704 (FIG. 7) to the cyclone evaporator 100 and an outlet portion to allow an introduction of carrier gas into evaporation chamber 302 (FIG. 3) as discussed below. In the embodiment shown in FIG. 1, carrier gas channel 104 includes carrier gas conduit 118, tap 120, and counterbore 122.

Carrier gas conduit 118 has a diameter of 0.270 inches. From the direct view perspective of FIG. 1, the center of carrier conduit 118 is 0.62 inches off the center of cyclone evaporator 100 and 0.53 inches below the bottom surface of cover 106. The carrier gas conduit 118 extends from the evaporator body 102 exterior surface 112 and opens into evaporation chamber 302 (FIG. 3). Carrier gas conduit 118 allows the introduction of carrier gas directly into the evaporation chamber 302 (FIG. 3). Carrier gas conduit 118 can accommodate the insertion of the carrier gas distribution system 710 (FIG. 7) through which carrier gas is introduced into the evaporation chamber 302 (FIG. 3).

Counterbore 122 is fabricated by counterboring a 1.00 inch diameter counterbore to a depth of 0.41 inches. The tap 120 is fabricated by tap drilling a 7/16 inch hole to a depth of 0.41 inches measured from the bottom of counterbore 122. Tap 120 is threaded with threads having a pitch of 20 threads per inch to secure fittings (not shown) connected to a carrier gas distribution system 710 (FIG. 7). Carrier gas conduit 118, tap 120, and counterbore 122 have the same center longitudinal axis as shown in FIG. 1.

The carrier gas source 704 (FIG. 7) is connected to the carrier gas channel 104 via suitable fittings and line. For example, face seal fittings may be used to attach a stainless steel tube to the carrier gas channel 104. A suitable fitting is the swagelock® O-seal straight thread male connector, model number SS-400-1-OR manufactured by Swagelock Co. of Solon, Ohio. The fittings (not shown) and distribution system 710 (FIG. 7) conveying the carrier gas from the carrier gas source 704 (FIG. 7) to the cyclone evaporator 100 preferably do not react with the carrier gas.

Although specific dimensions and locations have been specified, it will be readily apparent to those of ordinary skill in the art after reading this description that the carrier gas channel 104 may be fabricated in a variety of ways with a variety of dimensions which facilitate the introduction of carrier gas into the evaporation chamber 302 (FIG. 3) as discussed below.

FIG. 1 additionally illustrates heating element 124. One embodiment of heating element 124 is a band heater such as a Watlow 208V clamp-on resistance heater, model number STB3B3E1J1 manufactured by Watlow Electric Manufacturing Company of St. Louis, Mo. Heating element 124 has a thickness of 0.125 inches and a height of 1.50 inches.

Figure 2:
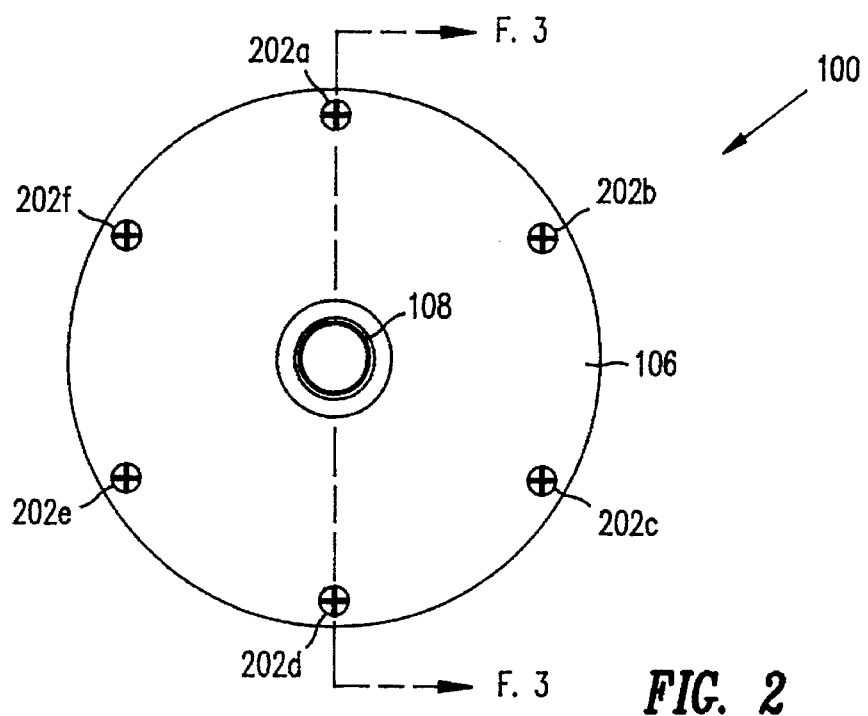
FIG. 2 illustrates a top plan view of the cyclone evaporator of FIG. 1.

Referring to FIG. 2, cyclone evaporator 100 is shown from a top view. Holes 202a–202f pass through cover 106 and into flange 110 (FIG. 3), where they are threaded to accommodate screws. Screws (not shown) are inserted into the holes 202a–202f to removably secure cover 106 to flange 110.

Referring to FIG. 3, a cross-sectional side view of cyclone evaporator 100 is shown. The interior of evaporator body 102 is bored out to form walls defining evaporator chamber 302. Evaporator chamber 302 has a physical shape to facilitate directing carrier gas, liquid precursor, and gas precursor flow into a cyclonic flow within evaporator chamber 302. Upper portion 314 of evaporator chamber 302 is cylindrical in shape with a diameter of 1.50 inches and includes sidewall 304. Lower portion 316 of evaporator chamber 302 includes downwardly tapered sidewall 306. Sidewall 304 is parallel to the longitudinal axis of the cyclone evaporator 100 and is 2.0 inches in length measured from the bottom of cover 106 to the sidewall slope transition 318. At the sidewall slope transition 318, sidewall 306 tapers at a 15 degree angle to a bottom surface 320 of evaporator chamber 302. The purpose of the slope transition is set forth below. The sidewalls 304 and 306 are preferably smooth to minimize turbulent material flow within evaporator chamber 302. The longitudinal distance from the bottom surface 320 to the top surface of the evaporation chamber 302, which is the bottom of cover 106, is 5.0 inches. The shape of the evaporation chamber 302 surface which includes sidewalls 304 and 306 also offers a large surface area, while occupying a relatively small amount of space.

Ideally, the diameter of the evaporation chamber 302 is reduced by a function that provides a uniform liquid precursor thin film distribution along the sidewalls of evaporation chamber 302. For manufacturing efficiency and cost effectiveness, the ideal situation is satisfactorily approximated by the linear reduction of the diameter of evaporation chamber 302 beginning at the sidewall slope transition 318 only in lower portion 316 to produce linearly tapered sidewall 306. The evaporation chamber 302 diameter reduces from 1.50 inches at sidewall slope transition 318 to 1.00 inches at bottom 320. The shape of the evaporation chamber 302 may be characterized by a vertical cylinder upper portion 314 and a conical lower portion 316 having a truncated bottom.

Although a specific shape of the evaporation chamber 302 has been specified, it will be readily apparent to those of ordinary skill in the art after reading this description that the evaporator chamber 302 may have any shape that facilitates inertial separation, as discussed below, of liquid precursor from carrier gas.

FIG. 3 further illustrates in cross section an outlet tube 308. Outlet tube 308 is preferably fabricated as an integral part of cover 106. Outlet tube 308 is cylindrical in shape with an inner diameter of 0.75 inches, an outer diameter of 1.00 inches, and a length of 3.00 inches. The evaporation chamber 302 communicates with vapor port 108 through the outlet tube 308.

FIG. 3 further illustrates in cross section an annular groove 310. Annular groove 310 accommodates an O-ring (not shown) to effectively isolate evaporation chamber 302 from the ambient surrounding evaporator body 102. The O-ring (not shown) is preferably made of any suitable non-reactive sealing material such as Viton® Copolymer that will effectively provide the isolation between evaporation chamber 302 and the ambient surrounding evaporator body 102.

Figure 4:
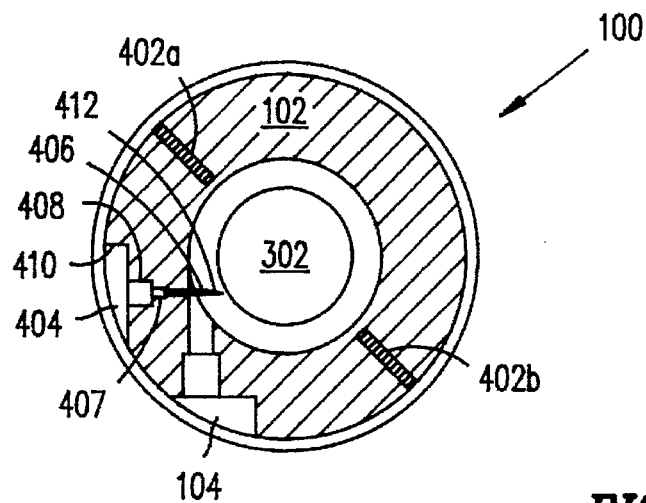
FIG. 4 illustrates a cross-sectional view of the cyclone evaporator of FIGS. 1 and 2, taken at section F.4 shown in FIG. 1.

FIG. 4 illustrates a cross-sectional top view of cyclone evaporator 100. Holes 402a and 402b are identical and have a diameter of 0.125 inches and a depth of 0.7 inches. The holes 402a and 402b accommodate thermocouples (not shown) which monitor the temperature of the evaporator body 102 and provide feedback to a temperature control device (not shown) connected to the heater 124.

Referring to FIG. 4, liquid precursor channel 404 is shown from a top cross-sectional view. Liquid precursor channel 404 is fabricated having an inlet portion to accommodate connection of a liquid precursor source 702 (FIG. 7) to the cyclone evaporator 100 and an outlet portion to allow an introduction of liquid precursor into the evaporation chamber 302 as discussed below. Liquid precursor channel 404 includes a liquid precursor tube 406 when inserted in liquid precursor channel 404, liquid precursor tube conduit 407, tap 408, and counterbore 410.

Fabrication of liquid precursor tube conduit 407 involves drilling a 0.068 inch diameter through hole. From a direct view perspective (not shown), the center of liquid precursor tube conduit 407 is 0.25 inches off the center of cyclone evaporator 100 and 0.53 inches below the bottom surface of cover 106. The liquid precursor tube conduit 407 extends from the tap 408 and opens into the evaporation chamber 302. Liquid precursor tube conduit 407 allows the insertion of a liquid precursor tube 406 through which liquid precursor is introduced into the evaporation chamber 302.

Counterbore 410 is fabricated by counterboring a 1.00 inch counterbore to a depth of 0.19 inches. The tap 408 is fabricated by tap drilling a 5/16 inch hole to a depth of 0.34 inches from the bottom of counterbore 410. Tap 408 is threaded with threads having a pitch of 24 threads per inch to secure fittings (not shown) coupled to the liquid precursor tube 406. Liquid precursor tube 406, liquid precursor tube conduit 407, tap 408, and counterbore 410 have the same center longitudinal axis.

The liquid precursor tube 406 is preferably made of stainless steel or another inert material with an end for receiving liquid precursor from liquid precursor source 702 (FIG. 7), another end preferably extending into evaporation chamber 302 for dispensing liquid precursor into the evaporation chamber 302, and a body disposed within liquid precursor tube conduit 407. The liquid precursor tube 406 has an inside diameter of 0.040 inches and an outside diameter of 0.063 inches.

Liquid precursor source 702 (FIG. 7) is connected to the liquid precursor channel 404 via suitable fittings (not shown) and distribution system 708 (FIG. 7). For example, face seal fittings may be used to attach a stainless steel tube to the liquid precursor channel 404. A suitable fitting is a Swagelock® O-seal straight thread male connector, model number SS-400-1-OR manufactured by Swagelock Co. The fittings (not shown) and distribution system 708 (FIG. 7) conveying the liquid precursor from the liquid precursor source 702 (FIG. 7) to the cyclone evaporator 100 preferably do not react with liquid precursor.

Liquid precursor tube 406 is inserted through liquid precursor channel 404 and extends into evaporation chamber 302 parallel to a horizontal plane of cyclone evaporator 100. The liquid precursor tube 406 is preferably directly connected to the liquid precursor source 702 (FIG. 7) via distribution system 708 (FIG. 7). An atomizer nozzle 412 is formed at the dispensing end of liquid precursor tube 406 as an integral feature. Alternatively, atomizer nozzle 412 may be formed separately from liquid precursor tube 406 and secured to liquid precursor tube 406 using a suitable means, for example, forming complementary threaded features in atomizer nozzle 412 and liquid precursor tube 406 and screwing atomizer nozzle 412 and liquid precursor tube 406 together. The dispensing opening of atomizer nozzle 412 is preferably beveled at a 45° angle. The dispensing opening of atomizer nozzle 412 faces away from the carrier gas channel 104. During operation, atomizer nozzle 412 is preferably centered in the carrier gas flow directly exiting from carrier gas channel 104. Centering is accomplished using the Swagelock® connector which also prevents displacement of the liquid precursor tube 406 and atomizer nozzle 412 during operation.

In FIG. 4, the longitudinal, center axes of carrier gas channel 104 and liquid precursor channel 404 are perpendicularly oriented with respect to each other for reasons set forth below. The liquid precursor channel 404 opens into the evaporation chamber 302 approximately adjacent to the opening of the carrier gas channel 104 into the evaporation chamber 302. Although the liquid precursor channel 404 and liquid precursor tube 406 have been specifically described, liquid precursor channel and liquid precursor tube variations for facilitating the introduction of liquid precursor into the evaporation chamber 302 as discussed below and producing a fine spray of liquid precursor droplets, respectively, will be apparent to those of ordinary skill in the art after reading this description.

In operation, a liquid precursor is introduced through the liquid precursor channel 404 into the evaporation chamber 302. Carrier gas is also introduced into the evaporation chamber 302 through carrier gas channel 104 at an orientation to intersect the introduced liquid precursor. The carrier gas entrains the liquid precursor and distributes the liquid precursor within the evaporation chamber. The entrained liquid precursor, the carrier gas, and vapor phase precursor ("gas precursor") flow within the cyclone evaporator circularly and toward bottom 320 i.e. cyclonically. The shape of the evaporation chamber 302 rapidly changes the direction of the entrained liquid precursor, and the momentum of the liquid precursor carries it to the sidewalls 304 and 306. The liquid precursor then deposits and spreads into a thin film on sidewalls 304 and 306. The thin film "wets" an area of the sidewalls 304 and 306 which is referred to as a "wetting area." Heater 124 heats sidewalls 304 and 306 to evaporate the thin film of the liquid precursor on the sidewalls 304 and 306 to form vapor phase liquid precursor ("gas precursor").

Referring to FIGS. 1, 3, and 4, carrier gas is preferably introduced tangentially to sidewall 304 and parallel to a horizontal plane of cyclone evaporator 100. The tangential introduction of the carrier gas assists in minimizing perturbations of cyclonic gas flow within evaporation chamber 302 by directing the carrier gas flow to immediately conform to the contour of sidewall 304. The carrier gas is preferably an inert gas, i.e. the carrier gas does not react with any other materials present within the evaporation chamber 302. For example, suitable carrier gases are nitrogen ($N_2$) and/or argon (Ar).

The liquid precursor is introduced under pressure through liquid precursor tube 406 into the evaporation chamber 302. Preferably, only small, atomized liquid precursor droplets are introduced into evaporation chamber 302. Carrier gas velocity and liquid precursor flow rate are proportionately adjusted to prevent the formation of relatively large liquid precursor droplets having a sufficient mass to avoid entrainment in the carrier gas. The bottom region of evaporation chamber 302 includes bottom surface 320 and a contiguous, lower portion of sidewall 306, which meet preferably at a continuous surface, and serves as a liquid particle trap to prevent liquid from exiting the cyclone evaporator 100 through vapor port 108 during operation. To avoid the introduction of the relatively large droplets of liquid precursor into the evaporation chamber 302, the liquid precursor tube 406 produces a fine spray of liquid precursor droplets. The small diameter of the liquid precursor tube 406 and a Venturi effect assist in the production of the fine spray of liquid precursor droplets. Additionally, orienting the carrier gas channel 104 and liquid precursor channel 404 at right angles to each other further reduces the size of the liquid precursor spray droplets. The carrier gas atomizes the liquid precursor spray droplets by promoting shearing of the liquid precursor droplets by the carrier gas as they exit the liquid precursor tube 406.

To create the Venturi effect, the liquid precursor tube 406 is positioned directly into a path of carrier gas exiting the carrier gas channel 104. The dispensing end of atomizer nozzle 412 opens on the downstream side of the carrier gas. The beveled opening of atomizer nozzle 412 aids in preventing liquid precursor drops from clinging to the dispensing end of the liquid precursor tube 406. As the carrier gas flows past the liquid precursor tube 406, a low pressure region is created near the beveled opening of atomizer nozzle 412. The low pressure region assists the liquid precursor exit from the atomizer nozzle 412 into the low pressure region. As the liquid precursor exits into the low pressure region a fine spray is formed which becomes entrained in the carrier gas flowing past the liquid precursor tube 406.

The tangential introduction of the carrier gas forces the carrier gas, gas precursor, and entrained liquid precursor to follow the contour of the sidewalls 304 and 306 in a circular flow. CVD reactor assembly 706 (FIG. 7) is connected to vapor port 108 via distribution system 712. The CVD reactor assembly 706 (FIG. 7) is at a somewhat lower pressure than the pressure in the evaporation chamber 302; this creates a differential pressure between the upper portion 314 and the lower portion 316 of the evaporation chamber 302. The pressure differential between evaporation chamber 302 and a CVD chamber of CVD reactor assembly 706 depends upon distribution system 712. Variations in tubing diameter, the number of bands fittings used will lead to large variations of pressure differences. Also, the absolute pressure of the CVD chamber pressure and interior gas flow rate will affect the pressure drop. For a particular plumbing configuration with 6 standard liters per minute ("slm") of $N_2$ flow and 10 torr of CVD chamber pressure, the pressure differential was measured to be 20 torr during vaporization of tetradiethylaminotitanium ("TDEAT"). When the CVD reactor assembly 706 (FIG. 7) is at a lower pressure than the pressure within the evaporation chamber 302, the pressure in outlet tube 308 and in the lower portion 316 near inlet 312 is lower than the pressure in the upper portion 314. The pressure gradient between the upper and lower portions 314 and 316, respectively, of the evaporation chamber 302 influences the longitudinal direction of the carrier gas and entrained liquid precursor and draws the carrier gas, gas precursor, and entrained liquid precursor into a downward flow toward the lower portion 316 and toward inlet 312. The circular flow and downward flow are two flow components which combine to cause cyclonic flow of carrier gas, gas precursor, and entrained liquid precursor. The carrier gas and gas precursor are drawn into outlet tube 308 through inlet 312 and out of vapor port 108. The cyclone evaporator 100 functions adequately in any desired orientation although an upright position is preferable.

The liquid precursor spray droplets in the evaporation chamber 302 are subjected to various forces during operation of the cyclone evaporator 100. Forces acting on the liquid precursor spray droplets aid in depositing the liquid precursor spray droplets on sidewalls 304 and 306 and help create a thin film of liquid precursor on the sidewalls 304 and 306. Creation of the thin film in turn aids in evaporating the liquid precursor to create the gas precursor.

In areas of cyclonic flow, the flowing carrier gas and entrained liquid precursor spray droplets are continuously subjected to angular acceleration forces due to the rapidly changing direction of carrier gas flow. The inertia of the liquid precursor spray droplets opposes the angular acceleration forces. When a liquid precursor spray droplet's opposition to the angular acceleration forces is greater than the forces of entrainment, the liquid precursor spray droplet separates from the carrier gas flow or, in other words, the liquid precursor spray droplet undergoes "inertial separation". Because inertia is directly proportional to mass, and the annular acceleration forces are directly proportional to carrier gas velocity, larger entrained liquid spray droplets will generally undergo inertial separation at lower carrier gas velocities.

As discussed above, the flow of carrier gas and entrained liquid precursor spray droplets proceeds toward bottom 320. The velocity of carrier gas and entrained liquid precursor is greater in lower portion 316 than in upper portion 314. In the lower portion 316, the diameter of the evaporation chamber 302 tapers. As the diameter of the evaporation chamber 302 tapers beginning at sidewall slope transition 318, the flow rate of carrier gas and remaining entrained liquid precursor droplets increases. As the carrier gas velocity increases, the angular acceleration force also increases so that liquid precursor droplets of insufficient mass to undergo inertial separation in upper portion 314 undergo inertial separation in the lower portion 316. Therefore, very small liquid precursor droplets impinge on the sidewall 306 rather than remain entrained in the carrier gas flow and exit the cyclone evaporator 100 as liquid.

When the liquid precursor spray droplets undergo inertial separation from the carrier gas flow, they impinge on an area of the evaporation chamber 302 sidewall proximate to the location of inertial separation. The impingement assists in spreading the liquid precursor along the sidewall of evaporation chamber 302. The liquid precursor present on sidewalls. 304 and 306 also undergoes a shear force exerted by carrier gas on the liquid precursor present on the sidewalls 304 and 306. This shear force accelerates the liquid precursor normal to the direction of contact and further spreads the liquid precursor into a thin film along the sidewalls 304 and 306 to create a large wetting area.

The thermal conductivity of evaporator body 102 transfers heat generated by heater 124 to the surface of evaporation chamber 302 including sidewalls 304 and 306. The sidewalls 304 and 306 transfer thermal energy to the thin film of liquid precursor present on the sidewalls 304 and 306. The thin film then evaporates and forms gas precursor. Because the thickness of the thin film is approximately uniform, cyclone evaporator 100 operating parameter can be adjusted to control evaporation and prevent decomposition of the liquid precursor, and produce a gas precursor of uniform composition. The gas precursor enters the cyclonic flow of carrier gas and proceeds toward the bottom surface 320. As a vapor, the thermal energy of the gas precursor reduces the probability of reabsorption onto the sidewalls 304 and 306. As a result, the gas precursor remains in the carrier gas flow. The low pressure within the outlet tube 308 draws the gas precursor through inlet 312 and into outlet tube 308. The low pressure in the attached CVD reactor assembly 706 (FIG. 7) draws the gas precursor through the outlet tube 308 to vapor port 108. The gas precursor then exits the cyclone evaporator 100 through vapor port 108 and proceeds to the CVD reactor assembly 706 (FIG. 7).

It is desirable to tailor the gas precursor flow rate to the desired reaction kinetics of the CVD process. By adjusting several variables, a desired gas precursor flow rate is achieved to efficiently and accurately sustain the CVD process. Several variables affect the flow rate of gas precursor into the CVD reactor assembly 706 (FIG. 7). For example, the temperatures of the carrier gas and liquid precursor upon introduction into the evaporation chamber 302, the temperature of the evaporation chamber 302 surface including sidewalls 304 and 306, the surface area of the evaporation chamber 302 surface, evaporation chamber 302 geometry, the carrier gas velocity, the liquid precursor flow rate, the carrier gas composition, the liquid precursor composition, and the evaporation chamber 302 pressure are all variables affecting the production and flow rate of gas precursor. For example, when evaporating the low vapor pressure and low decomposition point liquid precursor TDEAT using a nitrogen carrier gas in cyclone evaporator 100, the liquid precursor is introduced at a temperature of 27° C., the carrier gas is introduced at a temperature of 120° C., the evaporation chamber 302 surface is heated to a temperature of 120° C., the flow rate of the carrier gas is 6 slm, the liquid precursor flow rate is 0.2 ml/min resulting in a TDEAT gas precursor flow rate out of vapor port 108 of 15 standard cubic centimeters per minute ("sccm"). Any suitable flow rate of the TDEAT liquid precursor may be used; flow rates are preferably between 0 and 0.5 ml/min. Evaporation is aided by higher temperatures, higher carrier gas flow, larger wetted area, lower evaporation chamber 302 pressure, and lower liquid precursor flow rates. The cyclone evaporator 100 may be used to evaporate any other liquid precursor and particularly low vapor pressure liquids such as Copper$^{I}$ (hexafluoroacetylacetonate) Trimethylvinylysilane ("Cu(hfac)(TMVS)"), Triisobutylaluminum ("TIBA"), and tetraethylorthosilicate ("TEOS").

In the event of a heater 124 failure or a carrier gas and/or liquid precursor distribution system failure, liquid precursor may accumulate at the bottom surface 320. In order to detect a failure before an uncontrolled evaporation of liquid precursor occurs, a liquid detection sensor (not shown), for example an optical sensor, may be incorporated into the evaporator body 102. The liquid detection sensor (not shown) detects the presence of liquid accumulation and transmits a failure signal to an operator or control device. The failure could then be diagnosed and appropriate corrective measures taken prior to an uncontrolled evaporation of liquid precursor.

In an alternative embodiment of cyclone evaporator 100, the creation of liquid precursor channel 404 is omitted, or, alternatively, liquid precursor channel 404 is sealed. In this alternative embodiment, liquid precursor and carrier gas are both dispensed through carrier gas channel 104 approximately tangentially to the wall of evaporator chamber 302 and approximately parallel to a horizontal plane of cyclone evaporator 100. Additionally, in this alternative embodiment liquid precursor and carrier gas are dispensed through a liquid precursor and carrier gas dispensing assembly 500 shown in FIG. 5.

Referring to FIG. 5, the liquid precursor and carrier gas dispensing assembly 500 includes a liquid precursor/carrier gas conduit 502. Liquid precursor/carrier gas conduit 502 is preferably cylindrical with a 0.25 inch outside diameter and includes an integral, annular carrier gas tube 506 having a diameter of 0.069 inches. Multi-port elbow connector 508 includes multiple attachment sites. A first port of connector 508 is attached to the liquid precursor/carrier gas conduit 502 opposite the co-axial nozzle 514. Carrier gas inlet tube 510 having a 0.25 inch outside diameter is attached to a second port of connector 508. Liquid precursor inlet tube 512 is inserted through a third port and attached to connector 508 with a SS-400-1-OR Swagelock® connecting device. Liquid precursor tube. 512 having an outside diameter of 0.062 inches and an inside diameter of 0.020 inches extends through carrier gas tube 506. Liquid precursor inlet tube 512 is preferably concentrically aligned within carrier gas tube 506 but may be displaced in any radial direction within carrier gas tube 506. The liquid precursor and carrier gas dispensing assembly 500 is preferably made of stainless steel although other inert materials may be used as well.

Figure 6:
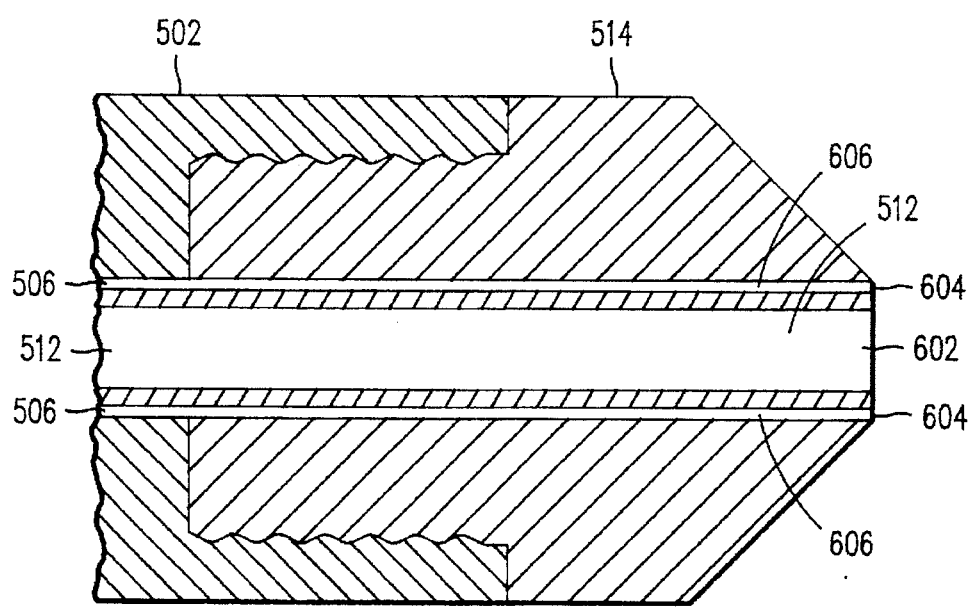
FIG. 6 illustrates a close up view of a co-axial nozzle.

Referring to FIG. 6, a close up view of co-axial nozzle 514 is illustrated. Co-axial nozzle 514 is threadedly fastened to the dispensing end of liquid precursor/carrier gas conduit 502. Annular carrier gas tube 606 is directly aligned with carrier gas tube 506, and the liquid precursor inlet tube 512 continues into co-axial nozzle 514. Liquid precursor inlet tube 512 terminates at liquid precursor dispensing opening 602, and carrier gas tube 506 terminates at annular carrier gas dispensing opening 604. Although some axial displacement is acceptable, the liquid precursor inlet tube 512 and carrier gas tube 606 preferably have coincident openings, 602 and 604, respectively. The carrier gas tube 606 has a diameter of 0.069 inches. The diameter of carrier gas tubes 506 and 606 may be varied depending upon desired flow rates and carrier gas velocities. The size of the carrier gas dispensing opening 604 is preferably less than or equal to the size of the carrier tube 506 and serves as a restriction to carrier gas flow.

Figure 5:
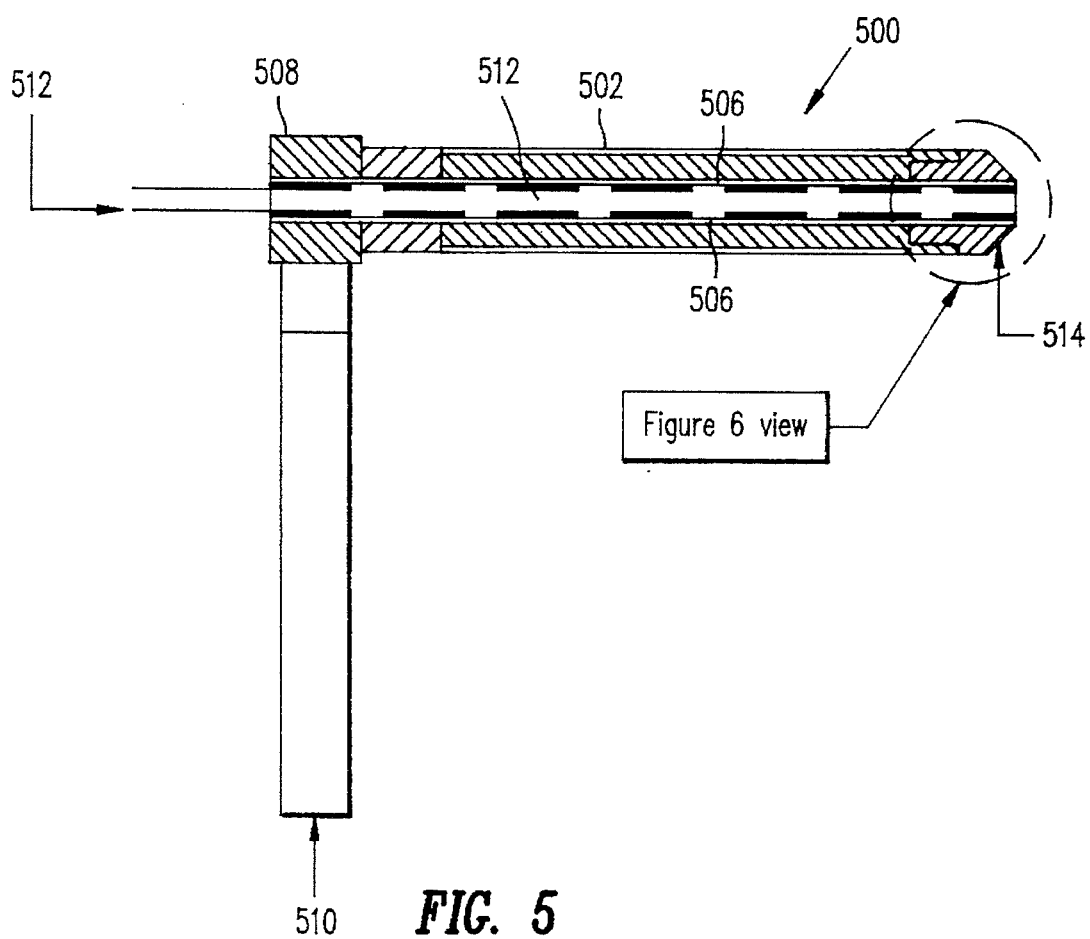
FIG. 5 illustrates a co-axial liquid precursor and carrier gas dispensing assembly.

Referring to FIGS. 5 and 6, during operation carrier gas enters carrier gas inlet tube 510, and liquid precursor enters liquid precursor inlet tube 512. Carrier gas and liquid precursor are isolated from each other within multi-port connector 508 and liquid precursor/carrier gas conduit 502 and co-axial nozzle 514. Carrier gas in the annulus between the outside wall of the liquid precursor inlet tube 512 and the carrier gas tubes 506 and 606 flows parallel to liquid precursor flowing in the liquid precursor inlet tube 512. Liquid precursor and carrier gas exit the liquid precursor/carrier gas conduit 502 through liquid precursor dispensing opening 602 and carrier gas dispensing opening 604, respectively. The carrier gas exiting the carrier gas dispensing opening 604 exits at very high velocities. The high velocity carrier gas imparts large shear forces on the liquid precursor as the liquid precursor emerges from the liquid precursor dispensing opening 602. These shear forces atomize the liquid precursor into liquid spray droplets having sufficiently small mass to become entrained in the carrier gas flow and having sufficiently large mass to undergo inertial separation from the carrier gas to form a thin film on evaporator chamber 302 (FIG. 3 and 4) sidewalls as discussed above. The co-axial nozzle produces the same performance as discussed above with regard to the transverse alignment of the liquid precursor tube 406 and carrier gas channel 104 while eliminating the preferable centering of liquid precursor atomizer nozzle 412.

The liquid precursor and carrier gas dispensing assembly 500 is secured to carrier gas channel 104 by a Swagelock® O-seal connector, model no. SS-100-1-08. The Swagelock® O-seal connector, model no. SS-100-1-08 sets the radial displacement of the assembly 500 so that the assembly 500 preferably perpendicularly intersects a tangential plane of sidewall 304 (FIG. 3). The dispensing end of assembly 500 is set to extend into the evaporator chamber 302 a distance of 0.43 inches from the sidewall 304.

The cyclone evaporator 100 may be used in conjunction with liquid precursor and carrier gas dispensing assembly 500 for dispensing any liquid precursor. For example, cyclone evaporator 100 in conjunction with liquid precursor and carrier gas dispensing assembly 500 is used to evaporate TDEAT as described above.

In another alternative embodiment, to increase the wetting area in evaporation chamber 302, the surface area of evaporation chamber 302 can be increased and the carrier gas flow within evaporation chamber 302 can be prescribed using structural features incorporated within evaporation chamber 302. For example, sidewalls 304 and 306, rather than being smooth, may be fabricated with striations. The striations approximate a finely pitched screw thread and begin adjacent to the bottom of cover 106. The striations spiral down toward bottom surface 320 and terminate at the bottom surface 320. The striations impart mechanical directionality to the carrier gas flow, entrained liquid precursor, and gas precursor flow and to the liquid precursor deposited on the sidewalls 304 and 306. The striations increase the surface area of sidewalls 304 and 306 allowing the establishment of a larger wetting area.

Referring to FIG. 7, a block diagram of a chemical vapor deposition system 700 is illustrated. A liquid precursor source 702 and a carrier gas source 704 are shown coupled to cyclone evaporator 100. Cyclone evaporator 100 is coupled to CVD reactor assembly 706. Liquid precursor distribution system 708 conducts liquid precursor from liquid precursor source 702 to cyclone evaporator 100 and is preferably made of stainless steel tubing. Carrier gas distribution system 710 conducts carrier gas from carrier gas source 704 to cyclone evaporator 100 and is preferably made of stainless steel tubing. Gas precursor distribution system 712 conducts gas precursor from cyclone evaporator 100 to CVD reactor assembly 706 and is preferably made of stainless steel tubing. The end arrows of liquid precursor distribution system 708, carrier gas distribution system 710, and gas precursor distribution system 712 indicate the direction of fluid flow. CVD reactor assembly 706 may be any suitable CVD reactor assembly such as, for example, a thermal CVD reactor assembly or a plasma enhanced CVD reactor assembly. Liquid precursor source 702 is a pressurized bottle or any other suitable liquid precursor source containing liquid precursor. Carrier gas source 704 is a pressurized bottle or any other suitable carrier gas source containing carrier gas. It will be recognized by those of ordinary skill in the art after reading this description that CVD reactor assembly 706 may be any CVD reactor assembly with operating parameters being adjusted to accommodate the particular gas precursor or gas precursors utilized.

It will be appreciated that the variations and modifications to the embodiments described above are possible. For example, the cover 106 and evaporator body 102 could be integrated and the heater 124 separated from the evaporator body 102 to form a single integrated cyclone evaporator. Moreover, other angular and positional orientations of liquid precursor channel 404 and carrier gas channel 104 are possible, such as orienting the liquid precursor channel 404 to introduce liquid precursor perpendicularly to sidewall 304. Additionally, the liquid precursor tube 406 may be modified by cutting the dispensing end at angles other than 45° such as 90°. Furthermore, the liquid precursor tube 406 may be positioned in different locations to extend further into the carrier gas flow or retract toward or into the evaporator body 102. Also, a channel could be provided through evaporator body 102 to bottom surface 320 to drain any accumulated liquid precursor. Additionally, structures other than curved sidewalls 304 and 306 may be used to facilitate a rapidly changing direction of carrier gas flow within evaporator chamber 302. For example, sidewalls 304 may be constructed of a plurality of multi-faceted surfaces or a combination of multi-faceted and curved surfaces. Additionally, although specific dimensions and locations have been specified, it will be readily apparent to those of ordinary skill in the art after reading this description that a variety of dimensions and locations may utilized to produce a cyclone evaporator such as cyclone evaporator 100. Accordingly, various other embodiments and modifications and improvements not described herein may be within the spirit and scope of the present invention, as defined by the following claims.

What is claimed is:

1. A chemical vapor deposition system comprising:

a carrier gas source;

a chemical vapor deposition reactor assembly having a gas precursor inlet;

an evaporator body;

an evaporation chamber disposed within the evaporator body, a wall of the evaporation chamber comprising a curved surface;

a heater arranged so as to transmit heat to at least a portion of the wall;

an atomizer having a carrier gas inlet and a liquid precursor inlet, and further having an opening into the evaporation chamber, the atomizer positioned so as to direct a stream of the carrier gas along a path generally tangent to the curved surface;

a vapor outlet extending through the evaporator body from the evaporation chamber;

a liquid precursor distribution system coupled between the liquid precursor source and the liquid precursor inlet;

a carrier gas distribution system coupled between the carrier gas source and the carrier gas inlet; and a gas precursor distribution system coupled between the vapor outlet and the gas precursor inlet.

2. The chemical vapor deposition system as in claim 1 wherein the liquid precursor source is a container enclosing a pressurized low vapor pressure liquid, and the low vapor pressure liquid is selected from the group consisting of Copper$^I$ (hexafluoroacetylacetonate) Trimethylvinysilane, triisobutylaluminum, tetraethylorthosilicate, and tetradiethylaminotitanium.

3. The chemical vapor deposition system as in claim 1 wherein the carrier gas source is a container enclosing nitrogen.

4. An evaporator for vaporizing a liquid precursor comprising:

a body;

a chamber formed within the body, the chamber being bounded by a wall, at least a portion of the wall being formed in a truncated conical shape which defines a wide end and a narrow end of the chamber;

an atomizer assembly having a carrier gas inlet and a liquid precursor inlet, the atomizer assembly being positioned so as to direct a stream comprising a carrier gas and entrained liquid precursor droplets into the chamber along a fixed path generally tangential to a curved surface of said wall, such that the carrier gas flows along a cyclonic path in a direction from the wide end towards the narrow end of the chamber; and a vapor outlet extending through the body from the chamber.

5. The evaporator as in claim 4 wherein the atomizer assembly comprises:

a liquid precursor passage extending through the body and having an outlet portion opening into the chamber;

a carrier gas passage extending through the body and having an outlet portion opening into the chamber, the carrier gas passage being positioned to atomize liquid precursor and to distribute the atomized liquid precursor on at least a portion of the wall of the chamber.

6. The evaporator as in claim 5, the atomizer assembly further including a liquid precursor/carrier gas conduit, wherein the carrier gas passage is disposed within the liquid precursor/carrier gas conduit, and the liquid precursor passage is disposed within the carrier gas passage, the atomizer assembly further including a co-axial atomizer nozzle having a first end coupled to the liquid precursor/carrier gas conduit and a second end opening into the evaporator chamber.

7. The evaporator as in claim 4 further comprising a heating element thermally coupled to the wall of the chamber.

8. The evaporator as in claim 7 wherein:

the evaporator is thermally conductive; and the heating element comprises a heating collar clamped to the evaporator body.

9. An evaporator as in claim 4 wherein:

the chamber is at least partially defined by a generally vertical wall;

the atomizer assembly includes a liquid precursor channel disposed in the body and in flow communication with the liquid precursor inlet, the liquid precursor channel comprising a liquid precursor tube which extends through the wall into the chamber, and a carrier gas channel in flow communication with the carrier gas inlet, the carrier gas channel being oriented perpendicular to the liquid precursor channel and extending through the wall into the chamber at a location proximate to a downstream end of the liquid precursor channel.

10. The evaporator as in claim 9 wherein the liquid precursor tube includes a 45 degree beveled dispensing end positioned proximate to the carrier gas channel to facilitate a Venturi effect.

11. An evaporator as in claim 9 wherein the liquid precursor inlet and carrier gas inlet are disposed in an upper region of the chamber, and wherein the vapor outlet comprises:

an outlet port disposed in an upper region of the evaporator body; and a conduit extending from the outlet port and through an upper region of the chamber into a lower region of the evaporator chamber.

12. An evaporator as in claim 9 wherein:

the vertical wall is a cylindrical wall in an upper region of the chamber, and the chamber further includes a lower region defined by a truncated, conical wall.

13. The evaporator as in claim 4 wherein the vapor outlet extends through the cover and opens into the chamber, and the body includes a cover, the evaporator further comprising:

an outlet tube circumscribing the vapor outlet and extending into the chamber.

14. The evaporator as in claim 4, wherein the evaporator body is aluminum.

15. An evaporator comprising:

a body;

an evaporation surface supported by the body, the evaporation surface being curved and having a first section that defines a first contained space of a cross-sectional area, and having a second section that defines a second contained space of a cross-sectional area less than the cross-sectional area of the first contained space;

a first port directed generally tangentially to the first section evaporator surface; and a second port for conducting a gas from the evaporator, the second port having an inlet disposed in the second contained space, space, the second port extending through the first contained space to a region external to the evaporator.

16. An evaporator as in claim 15, the first section being of a first diameter and curved about an axis, and the second section being of a second diameter less than the first diameter and curved about an axis.

17. An evaporator as in claim 15 wherein the evaporator surface is curved about an axis, the first section being of a first diameter over a first portion of the axis, and the second section being contiguous to the first section and of a diameter decreasing from the first diameter over a second portion of the axis extending from the first portion.

18. An evaporator as in claim 17 wherein the first section is a cylinder and the second section is a truncated cone.

19. An evaporator as in claim 15 further comprising an atomizer.

20. An evaporator as in claim 19 wherein the atomizer comprises:

a first conduit having an inlet end and outlet end, the outlet being outlet orifice of the atomizer; and a second conduit having an inlet end and an outlet end, the second conduit being traverse to the first conduit and the outlet end of the second conduit terminating in the first conduit.

21. An evaporator as in claim 19 wherein the atomizer comprises:

a first conduit having an inlet end and an outlet end, the outlet end being the outlet orifice of the atomizer; and a second conduit having an inlet end and an outlet end, the second conduit being disposed within the first conduit and the outlet end of the second conduit being coterminous with the outlet end of the first conduit.

22. An evaporator, comprising:

means for introducing liquid precursor into the evaporator;

means for introducing carrier gas into the evaporator to entrain the liquid precursor;

means for facilitating angular acceleration of the carrier gas to deposit the entrained liquid precursor on a surface of the evaporator; and means for heating the evaporator surface to evaporate the deposited liquid precursor.

23. The evaporator as in claim 22 further comprising:

means for forming a low pressure region within a lower portion of the evaporator; and means for drawing the evaporated liquid precursor out of the evaporator through a vapor outlet in an upper portion of the evaporator.

24. An evaporator for supplying a precursor gas to a chemical vapor deposition reactor, the evaporator comprising:

an evaporation chamber comprising an upper portion comprising a cylindrical wall and a lower portion comprising a truncated conical wall;

a first inlet line for carrying a precursor liquid and a second inlet line for carrying a carrier gas, the first and second lines having downstream terminals proximate to each other such that a flow of the precursor liquid through the first line interacts with a flow of the carrier gas through the second line at the terminal of the first line so as to create a mixed flow comprising droplets of the precursor liquid entrained in the carrier gas;

a heater for supplying thermal energy to a wall of the evaporation chamber; and an outlet line for conducting the precursor gas to the chemical vapor deposition reactor.

25. The evaporator as in claim 24 wherein a downstream end of the second line is oriented such that a flowpath of the carrier gas is generally tangent to a portion of the cylindrical wall as the carrier gas enters the evaporation chamber.

* * * * *

UNITED STATES PATENT AND TRADEMARK OFFICE
CERTIFICATE OF CORRECTION

PATENT NO.    :   5,653,813
DATED         :   August 5, 1997
INVENTOR(S)   :   Benzing, Jeffrey C.; McInerney, Edward J.; Susoeff, Michael N.

It is certified that error appears in the above-identified patent and that said Letters Patent is hereby corrected as shown below:

Column 8, line 30, delete "bands" and insert --bends and--.

Signed and Sealed this

Seventeenth Day of February, 1998

*Attest:*

BRUCE LEHMAN

*Attesting Officer*    *Commissioner of Patents and Trademarks*